(12) United States Patent
Okumura et al.

(10) Patent No.: US 9,601,330 B2
(45) Date of Patent: Mar. 21, 2017

(54) PLASMA PROCESSING DEVICE, AND PLASMA PROCESSING METHOD

(71) Applicant: Panasonic Intellectual Property Management Co., Ltd., Osaka (JP)

(72) Inventors: Tomohiro Okumura, Osaka (JP); Hiroshi Kawaura, Kanagawa (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/423,056

(22) PCT Filed: Sep. 11, 2013

(86) PCT No.: PCT/JP2013/005373
§ 371 (c)(1),
(2) Date: Feb. 20, 2015

(87) PCT Pub. No.: WO2014/045547
PCT Pub. Date: Mar. 27, 2014

(65) Prior Publication Data
US 2015/0294866 A1    Oct. 15, 2015

(30) Foreign Application Priority Data

Sep. 18, 2012 (JP) ................................. 2012-204066

(51) Int. Cl.
*C23C 16/00* (2006.01)
*H01L 21/02* (2006.01)
(Continued)

(52) U.S. Cl.
CPC ...... *H01L 21/02689* (2013.01); *H01J 37/321* (2013.01); *H01J 37/3211* (2013.01);
(Continued)

(58) Field of Classification Search
CPC ..... H01L 2027/11894; H01L 21/02351; H01L 21/26; H01L 21/42; H01L 21/423;
(Continued)

(56) References Cited

U.S. PATENT DOCUMENTS 4,431,898 A     2/1984  Reinberg et al.
2006/0289409 A1  12/2006 Choi et al.
(Continued)

FOREIGN PATENT DOCUMENTS

CN     101495262    7/2009
CN     102387653    3/2012
(Continued)

OTHER PUBLICATIONS

International Search Report of PCT application No. PCT/JP2013/005373 dated Dec. 17, 2013.
(Continued)

*Primary Examiner* — Julio J Maldonado
*Assistant Examiner* — Stanetta Isaac
(74) *Attorney, Agent, or Firm* — Panasonic IP Management; Kerry S. Culpepper

(57) ABSTRACT

To provide a plasma processing device and a plasma processing method capable of generating plasma stably and efficiently and processing the entire desired treated region of a substrate efficiently for a short period of time.

13 Claims, 8 Drawing Sheets

(51) Int. Cl.
*H01L 21/324* (2006.01)
*H05H 1/30* (2006.01)
*H01J 37/32* (2006.01)
*H01L 21/3065* (2006.01)
*H01L 21/311* (2006.01)

(52) U.S. Cl.
CPC .... *H01J 37/3244* (2013.01); *H01J 37/32055* (2013.01); *H01J 37/32458* (2013.01); *H01J 37/32651* (2013.01); *H01J 37/32715* (2013.01); *H01J 37/32733* (2013.01); *H01J 37/32807* (2013.01); *H01L 21/324* (2013.01); *H05H 1/30* (2013.01); *H01L 21/02164* (2013.01); *H01L 21/02274* (2013.01); *H01L 21/3065* (2013.01); *H01L 21/31138* (2013.01)

(58) Field of Classification Search
CPC . H01L 21/67115; C23C 16/50; C23C 16/503; C23C 16/505; C23C 16/507; C23C 16/509; C23C 16/5093; C23C 16/5096; C23C 16/515
See application file for complete search history.

(56) References Cited

U.S. PATENT DOCUMENTS

| | | |
|---|---|---|
| 2007/0075051 A1 | 4/2007 | Morrisroe |
| 2007/0245963 A1 | 10/2007 | Choi |
| 2009/0291027 A1 | 11/2009 | Choi |
| 2009/0304924 A1* | 12/2009 | Gadgil ............... C23C 16/4412 427/255.5 |
| 2012/0058649 A1 | 3/2012 | Okumura et al. |
| 2012/0097646 A1 | 4/2012 | Benjamin et al. |
| 2012/0115317 A1* | 5/2012 | Okumura .......... H01J 37/32412 438/513 |
| 2012/0325777 A1 | 12/2012 | Okumura et al. |
| 2013/0115780 A1 | 5/2013 | Okumura et al. |
| 2013/0146564 A1 | 6/2013 | Okumura |

FOREIGN PATENT DOCUMENTS

| | | |
|---|---|---|
| JP | 58-045736 | 3/1983 |
| JP | 11-251090 | 9/1999 |
| JP | 2001-093871 | 4/2001 |
| JP | 2004-047192 | 2/2004 |
| JP | 2006-332055 | 12/2006 |
| JP | 2007-287454 | 11/2007 |
| JP | 2007-294414 | 11/2007 |
| JP | 2008-503634 | 2/2008 |
| JP | 2008-537282 | 9/2008 |
| JP | 2009-283435 | 12/2009 |
| JP | 2012-038839 | 2/2012 |
| JP | 2012-054129 | 3/2012 |
| JP | 2012-054130 | 3/2012 |
| JP | 2012-054131 | 3/2012 |
| JP | 2012-054132 | 3/2012 |
| JP | 2012-174500 | 9/2012 |
| JP | 2013-120685 | 6/2013 |
| JP | 2013-120686 | 6/2013 |
| JP | 5467371 B | 4/2014 |
| JP | 5510437 B | 6/2014 |
| WO | 2011/142125 | 11/2011 |

OTHER PUBLICATIONS

S.Higashi, H.Kaku, T.Okada, H.Murakami and S.Miyazaki, Jpn. J.Appl. Phys. 45,5B(2006) pp. 4313-4320.
English Translation of Chinese Search Report dated Mar. 28, 2016 for the related Chinese Patent Application No. 201380047723.0.

* cited by examiner

PLASMA PROCESSING DEVICE, AND PLASMA PROCESSING METHOD

CROSS-REFERENCE TO RELATED APPLICATIONS

The present application is a U.S. national stage application of the PCT International Application No. PCT/JP2013/005373 filed on Sep. 11, 2013 and claims the benefit of foreign priority of Japanese Patent Application No. 2012-204066 filed on Sep. 18, 2012, the contents both of which are incorporated herein by reference.

TECHNICAL FIELD

The present invention relates to a plasma processing device and a plasma processing method for thermal plasma processing which processes a substrate by irradiating the substrate with thermal plasma, plasma processing by a reactant gas and low-temperature plasma processing which processes the substrate by irradiating the substrate with plasma and a reactant gas flow at the same time.

BACKGROUND ART

A semiconductor thin film such as polycrystalline silicon (poly-Si) is widely used for a thin-film transistor (TFT) and a solar cell in related art. In particular, the poly-Si TFT is widely used as a switching device included in a pixel circuit for a liquid crystal display device, a liquid crystal projector, an organic EL display device and so on, or a circuit device for a liquid crystal driver by utilizing characteristics that the TFT has high carrier mobility and can be fabricated on a transparent insulating substrate such as a glass substrate.

As a method of fabricating the high-performance TFT on the glass substrate, there is a manufacturing method generally called a "high-temperature process". In manufacturing processes of the TFT, a process performed at a high temperature of approximately 1000° C. as the maximum temperature in the operation is generally called the "high-temperature process". Characteristics of the high-temperature process are a point that relatively-high quality polycrystalline silicon can be deposited by solid phase growth of silicon, a point that a high-quality gate insulating layer can be obtained by thermal oxidation of silicon and a point that an interface between clean polycrystalline silicon and the gate insulating layer can be formed. It is possible to stably manufacture the high-performance TFT with high mobility and reliability according to the characteristics of the high-temperature process.

On the other hand, as the high-temperature process is a process performing crystallization of a silicon film by the solid phase growth, thermal processing at a temperature of approximately 600° C. for a long period of time of approximately 48 hours is necessary. This is a process of the very long period of time, and many heat treatment furnaces are consequently necessary for increasing a throughput of the process, therefore, there is a problem that it is difficult to reduce costs. Additionally, as quartz glass must be used as the insulating substrate having high heat resistance, the substrate costs high and is not suitable for increasing the area of the substrate.

On the other hand, a technique for reducing the maximum temperature in the process and fabricating the poly-SiTFT on an inexpensive glass substrate having a large area is called a "low-temperature process". In manufacturing processes of the TFT, a process of manufacturing the poly-SiTFT on the relatively inexpensive heat-resistance glass substrate under a temperature environment in which the maximum temperature is approximately 600° C. or less is generally called the "low-temperature process". In the low-temperature process, a laser crystallization technique for performing crystallization of the silicon film by using a pulse laser having an extremely-short oscillation time is widely used. The laser crystallization is a technique of utilizing a nature that the silicon thin film on the substrate is melted at once by irradiating the film with a high-output pulse laser beam and the silicon thin film is crystallized in the process of being solidified.

However, there are some large problems in the laser crystallization technique. One problem is that many trapping levels locally existing inside a polysilicon film formed by the laser crystallization technique. Due to the existence of trapping levels, carriers which should normally be moved in an active layer by voltage application are trapped, which does not contribute to conduction of electricity, as a result, adverse effects such as the reduction of the mobility and the increase a threshold voltage of the TFT may occur. Furthermore, there is also a problem that the size of the glass substrate is limited due to the limitation of laser output. It is necessary to increase the area which can be crystallized at one time in order to improve the throughput of the laser crystallization process. However, in the case where the crystallization technique is applied to a large-sized substrate such as the seventh generation (1800 mm×2100 mm), a long period of time is necessary for crystallizing a piece of substrate as there is the limitation in laser output in the present condition.

The laser crystallization technique generally uses a laser formed in a line shape, and the crystallization is performed by performing scanning by the laser. The line beam is shorter than the width of the substrate as there is the limitation in laser output, and it is necessary to scan the substrate by the laser at plural times for crystallizing the entire surface of the substrate. Accordingly, a region of a joint between line beams is generated in the substrate, and there exists a region to be scanned twice. The region largely differs from the region crystallized by the scanning of one time in crystallinity. Therefore, device characteristics of both regions largely differ, which will be a major factor of device variations.

Lastly, there is a problem that the device costs and the running costs are high as the device configuration is complicated as well as the cost of consumable components is high in the laser crystallization device. Accordingly, the TFT using the polysilicon film crystallized by the laser crystallization device will be a device manufacturing costs of which are high.

In order to solve the problems that the substrate size is limited and that the device costs are high, a crystallization technique called a "thermal-plasma jet crystallization method" has been studied (for example, refer to Non-Patent Literature 1). The present technique will be briefly explained below. When a tungsten (W) cathode is arranged opposite to a copper (Cu) anode which is cooled by water and a DC voltage is applied, an arc discharge occurs between both electrodes. The thermal plasma is jetted from a jetting hole disposed on the copper anode by allowing an argon gas to flow between both electrodes under an atmospheric pressure.

The thermal plasma is thermal equilibrium plasma, which is a heat source of ultra-high temperature, in which temperatures of ions, electrons, neutral atoms are almost equivalent and these temperatures are approximately 10000 K.

Accordingly, the thermal plasma can easily heat a heat-treated object to a high temperature, and a substrate on which an a-Si (amorphous silicon) film is deposited is scanned in front of high-temperature thermal plasma at high speed, thereby crystallizing the a-Si film.

As the device configuration is extremely simple and the crystallization process is performed under the atmospheric pressure as described above, it is not necessary to cover the device with an expensive member such as an airtight chamber, and it can be expected that the device costs will be drastically reduced. Additionally, utilities necessary for crystallization are the argon gas, electricity and cooling water, therefore, the running costs are low in the crystallization technique.

FIG. 19 is a schematic view for explaining a crystallization method of a semiconductor film using the thermal plasma.

In the drawing, a thermal plasma generation device 31 is configured by including a cathode 32 and an anode 33 arranged opposite to the cathode 32 so as to be apart from each other by a given distance. The cathode 32 is made of a conductor such as tungsten. The anode 33 is made of a conductor such as copper. The anode 33 is formed to have a hollow, which can be cooled by allowing water to flow into the hollow portion. The anode 33 is also provided with a jetting hole (nozzle) 34. When a DC voltage is applied between the cathode 32 and the anode 33, the arc discharge occurs between both electrodes. A gas such as an argon gas is allowed to flow between the cathode 32 and the anode 33 under the atmospheric pressure in the above state, thereby jetting a thermal plasma 35 from the jetting hole 34.

Here, the thermal plasma is thermal equilibrium plasma, which is a heat source of ultra-high temperature, in which temperatures of ions, electrons, neutral atoms are almost equivalent and these temperatures are approximately 10000 K.

The above thermal plasma can be used for heat treatment for crystallizing the semiconductor film. Specifically, a semiconductor film 37 (for example, an amorphous silicon film) is formed on a substrate 36, and the thermal plasma (thermal plasma jet) 35 is applied to the semiconductor film 37. At this time, the thermal plasma 35 is applied to the semiconductor film 37 while relatively moving the thermal plasma 35 along a first axis (right and left direction in the shown example) parallel to the surface of the semiconductor film 37. That is, the thermal plasma 35 is applied to the semiconductor film 37 while being scanned in the first axis direction.

Here, "to relatively move" means that the semiconductor film 37 (and the substrate 36 supporting the film) and the thermal plasma 35 are relatively moved, including a case where one of them is moved and a case where both of them are moved. The semiconductor film 37 is heated by high-temperature possessed by the thermal plasma 35 by the scanning of the thermal plasma 35, thereby obtaining the crystallized semiconductor film 38 (a polysilicon film in the example) (for example, refer to Patent Literature 1).

FIG. 20 is a conceptual graph showing the relation between the depth from the outermost surface of the substrate and the temperature. As shown in the drawing, only the vicinity of the surface can be treated at high temperature by moving the thermal plasma 35 at high speed. After the thermal plasma 35 passes by, the heated region is rapidly cooled, therefore, the vicinity of the surface becomes high temperature for a short period of time.

It is general that the above thermal plasma is generated at dotted regions. The thermal plasma is maintained by discharging thermal electrons from the cathode 32. Accordingly, thermal electrons are discharged more actively in a position where the plasma density is high, therefore, positive feedback is performed and the plasma density becomes higher. That is, the arc discharge occurs in a state of being concentrated at one point of the cathode, and the thermal plasma is generated at dotted regions.

Though it is necessary to scan the entire substrate by the dotted thermal plasma in the case where a flat-plate shaped substrate is uniformly processed such as crystallization of the semiconductor film, and it is effective that a region irradiated by the thermal plasma is increased for constructing the process which can perform processing for a short period of time by reducing the number of scanning times. Accordingly, a technique of generating a long thermal plasma and scanning only in one direction has been considered (for example, refer to Patent Literatures 2 to 7).

CITATION LIST

Patent Literature

PTL 1: JP-A-2008-53634
PTL 2: WO2011/142125
PTL 3: JP-A-2012-38839
PTL 4: JP-A-2012-54129
PTL 5: JP-A-2012-54130
PTL 6: JP-A-2012-54131
PTL 7: JP-A-2012-54132

Non-Patent Literature

NON-PTL 1: S. Higashi, H. Kaku, T. Okada, H. Murakami and S. Miyazaki, Jpn. J. Appl. Phys. 45, 5B (2006) pp. 4313-4320

SUMMARY OF INVENTION

However, for an application in which high-temperature treatment is applied to the vicinity of the surface of the substrate for an extremely short period of time such as in the crystallization of semiconductor, a part where the plasma has the highest temperature is far from the substrate in the technique of generating the thermal plasma in a long shape described in Patent Literatures 2 to 7 shown in related art. Accordingly, there is a problem that it is difficult to sufficiently increase the temperature of the substrate.

The present invention has been made in view of the above problems, and an object thereof is to provide a plasma processing device and a plasma processing method capable of generating plasma stably and efficiently and processing the entire desired treated region of a substrate for a short period of time in a technique of performing high-temperature heat treatment uniformly to the vicinity of the surface of the substrate for an extremely short period of time, a plasma processing technique by a reactant gas and a low-temperature plasma processing technique of processing the substrate by irradiating the substrate with plasma and a reactant gas flow at the same time.

According to an embodiment of the present invention, there is provided a plasma processing device including an opening, an annular chamber communicated to the opening and surrounded by a dielectric member except for the opening, a gas supply pipe for introducing a gas to the inside of the annular chamber, a coil provided in the vicinity of the annular chamber, a high-frequency power supply connected to the coil, and a substrate mounting table for arranging the substrate close to the opening, in which the annular chamber is provided along a surface perpendicular to a surface formed by the substrate mounting table.

According to the above structure, it is possible to generate plasma stably and efficiently in a technique of performing high-temperature heat treatment to the vicinity of the surface of the substrate for a very short period of time, a plasma processing technique by a reactant gas and a low-temperature plasma processing technique of processing the substrate by irradiating the substrate with plasma and a reactant gas flow at the same time.

Also according to the embodiment of the present invention, there is provided a plasma processing method generating high-frequency electromagnetic fields in an annular chamber and generating plasma by supplying high-frequency power to a coil while supplying a gas into the annular chamber surrounded by a dielectric member except for the opening as well as processing the surface of the substrate by exposing the substrate with plasma in the vicinity of the opening while arranging the substrate close to the opening, which includes the step of generating plasma inside the annular chamber provided along a surface perpendicular to a surface formed by the substrate.

According to the above structure, it is possible to generate plasma stably and efficiently in the technique of performing high-temperature heat treatment to the vicinity of the surface of the substrate for a very short period of time, the plasma processing technique by the reactant gas and the low-temperature plasma processing technique of processing the substrate by irradiating the substrate with plasma and the reactant gas flow at the same time.

According to the embodiment of the present invention, it is possible to generate plasma stably and efficiently and the entire desired region in the substrate can be processed efficiently for a short period of time in the technique of performing high-temperature heat treatment to the vicinity of the surface of the substrate for a very short period of time, the plasma processing technique by the reactant gas and the low-temperature plasma processing technique of processing the substrate by irradiating the substrate with plasma and the reactant gas flow at the same time.

DESCRIPTION OF EMBODIMENTS

Hereinafter, a plasma processing device according to embodiments of the present invention will be explained with reference to the drawings.

Embodiment 1

Hereinafter, Embodiment 1 of the present invention will be explained with reference to FIG. 1A, FIG. 1B and FIG. 2.

Figure 1A:
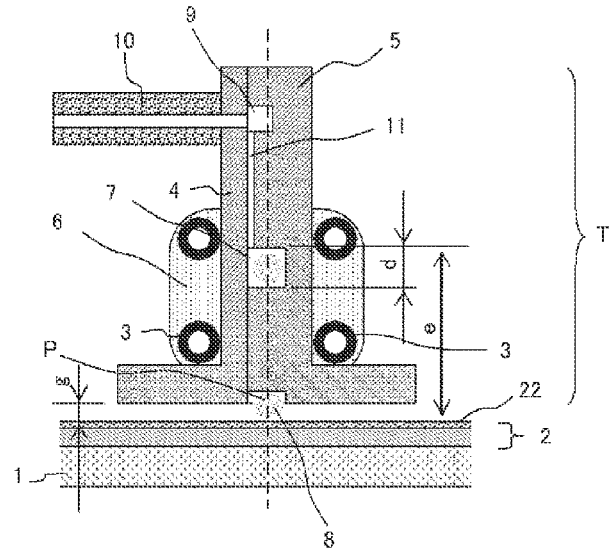
FIG. 1A is a cross-sectional view showing a structure of a plasma processing device according to Embodiment 1 of the present invention.

FIG. 1A shows a structure of a plasma processing device according to Embodiment 1 of the present invention, which is a cross-sectional view taken along a surface perpendicular to a longitudinal direction of an inductively-coupled plasma torch unit. FIG. 1B is a cross-sectional view taken along a surface parallel to the longitudinal direction of the inductively-coupled plasma torch unit as well as perpendicular to a substrate. FIG. 1A is a cross sectional view taken along a broken line of FIG. 1B, FIG. 1B is a cross-sectional view taken along a broken line of FIG. 1A and FIG. 2 is an assembly structure view of the inductively-coupled plasma torch unit shown in FIG. 1A and FIG. 1B, in which perspective views of respective parts (portions) are aligned.

Figure 1B:
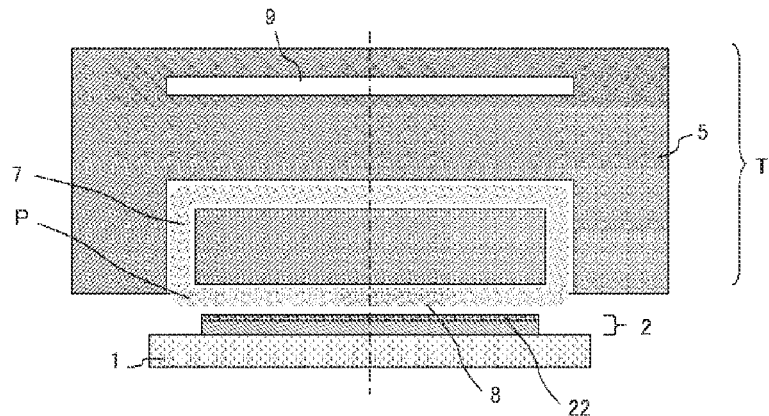
FIG. 1B is a cross-sectional view (view showing a cross section of a broken line in FIG. 1A) showing the structure of the plasma processing device according to Embodiment 1 of the present invention.
Figure 2:
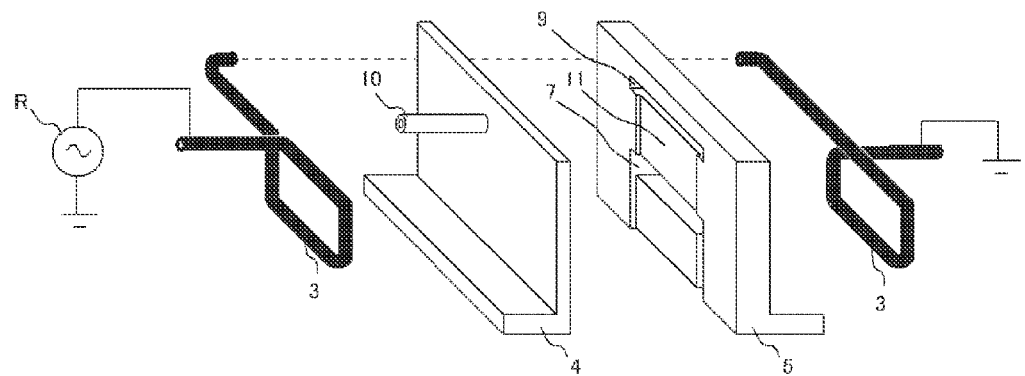
FIG. 2 is a perspective view showing the structure of the plasma processing device according to Embodiment 1 of the present invention.

In FIG. 1A, FIG. 1B and FIG. 2, a substrate 2 is mounted on a substrate mounting table 1. In an inductively-coupled plasma torch unit T, solenoid coils 3 made of a conductor are disposed in the vicinity of a first quartz block 4 and a second quartz block 5. A long chamber 7 made of a dielectric is defined by a space surrounded by surfaces of the first quartz block 4, the second quartz block 5 and the substrate 2. The long chamber 7 is provided along a surface perpendicular to a surface formed by the substrate mounting table 1.

The solenoid coils 3 are arranged so that the central axis thereof is parallel to the substrate mounting table 1 as well as perpendicular to a flat surface including the long chamber 7. That is, a surface formed by a winding of the solenoid coil 3 is arranged along the surface perpendicular to the surface formed by the substrate mounting table 1 as well as along the flat surface including the long chamber 7. The solenoid coils 3 are respectively arranged outside the first quartz block 4 and outside the second quartz block 5 as well as connected in series at positions apart from the long chamber so that directions of high-frequency electromagnetic fields generated in the long chamber are the same when high-frequency power is applied.

The device can function only by one of these two solenoid coils 3, however, there is an advantage that the intensity of the electromagnetic fields generated in the long chamber 7 can be increased by providing two coils in a state of interposing the long chamber 7 there between.

The inductively-coupled plasma torch unit T is surrounded by a shielding member (not shown) made of a conductor which is entirely grounded, therefore, leakage (noise) of high-frequency waves can be effectively prevented as well as undesirable abnormal discharge can be effectively prevented.

The long chamber 7 is surrounded by one flat surface of the first quartz block 4 and a groove provided in the second quartz block 5. The two dielectric blocks as dielectric members are bonded to each other. That is, the long chamber 7 is surrounded by the dielectric except an opening 8. The long chamber 7 has an annular shape. The annular shape means, in this case, a closed continuous string shape, and is not limited to a circular shape. In the embodiment, the chamber 7 having a rectangular shape (closed continuous string shape in which straight-line portions forming two long sides and straight lines forming two short sides are connected to both ends) is shown as an example.

Plasma P generated in the long chamber 7 contacts the substrate 2 in the opening 8 having a long linear shape in the long chamber 7. The longitudinal direction of the long chamber 7 is arranged in parallel to the longitudinal direction of the opening 8. An opening width of the opening 8 is almost equal to a width of the annular chamber (a size "d" of a closed continuous passage forming the annular chamber in FIG. 1A).

A plasma gas manifold 9 is provided inside the second quartz block 5. The gas supplied from a plasma gas supply pipe 10 to the plasma gas manifold 9 is introduced to the long chamber 7 through a plasma gas supply hole 11 (through hole) as a gas introducing portion provided in the second quartz block 5. According to the structure, the gas flow which is uniform in the longitudinal direction can be easily realized. A flow amount of the gas to be introduced to the plasma gas supply pipe 10 is controlled by providing a flow controller such as a mass-flow controller in the upstream.

The plasma gas supply hole 11 is a long slit or may be constructed by forming plural round holes in the longitudinal direction.

Each solenoid coil 3 is formed by a hollow copper pipe, and the inside of the pipe is a flow path for refrigerant. The thermal conduction between armor portions of the solenoid coils 3 and the first quartz block 4 as well as the second quartz block 5 is secured according to an adhesive 6. Accordingly, the solenoid coils 3, the first quartz block 4 and the second quartz block 5 can be cooled by allowing a refrigerant such as water to flow in copper pipes forming the solenoid coils 3.

The rectangular linear opening 8 is provided, and the substrate mounting table 1 (or the substrate 2 on the substrate mounting table 1) is arranged opposite to the opening 8. The high frequency power is supplied to the solenoid coils 3 from a high-frequency power supply R while supplying the gas into the long chamber and ejecting the gas from the opening 8 toward the substrate 2 in the above state, thereby generating the plasma P in the long chamber 7. The plasma near the opening 8 is exposed to the substrate 2, thereby performing plasma processing to the thin film 22 on the substrate 2.

The substrate 2 is processed by moving the long chamber 7 and the substrate mounting table 1 relatively in a direction perpendicular to the longitudinal direction of the opening 8. That is, the inductively-coupled plasma torch unit T or the substrate mounting table 1 is moved in a right and left direction of FIG. 1A as well as in a direction perpendicular to the paper surface of FIG. 1B.

Various kinds of gases can be used as the gas to be supplied to the long chamber, but it is desirable to mainly use inert gases, when considering stability and ignition performance of plasma, lifetime of members exposed with plasma and so on. Among them, an Ar gas is typically used. When plasma is generated only by the Ar gas, plasma will be a considerably high temperature (10,000 K or more).

A high frequency power of 13.56 MHz is supplied to the solenoid coils 3 from the high-frequency power supply R while supplying the Ar gas or an Ar+$H_2$ gas into the long chamber 7 from the plasma gas supply hole 11 and ejecting the gas from the opening 8 toward the substrate 2 in the above plasma processing device, thereby generating high-frequency electromagnetic fields in the long chamber 7 to generate the plasma P. The plasma near the opening 8 is exposed to the substrate 2 and scanned, thereby performing heat treatment such as crystallization of a semiconductor film and so on.

As conditions for generating plasma, appropriate values are approximately: scanning speed=50 to 3000 mm/s, the total flow amount of plasma gas=1 to 100 SLM, $H_2$ density in Ar+$H_2$ gas=0 to 10%, and high frequency power=0.5 to 50 kW. The gas flow amount and the power in these values show values per a length 100 mm of the opening 8. It is because, it is suitable that an amount proportional to the length of the opening 8 is inputted concerning parameters such as the gas flow amount and the power.

As described above, the long chamber and the substrate mounting table 1 are relatively moved in the direction perpendicular to the longitudinal direction of the opening 8 while the longitudinal direction of the opening 8 is arranged in parallel to the substrate mounting table 1, therefore, it is possible to construct the device so that the length of plasma to be generated is substantially equivalent to the length of the substrate 2 to be processed as shown in FIG. 1B.

Additionally, the long chamber 7 has the annual shape in the embodiment. A distance (a size "g" in FIG. 1A) between the lowermost surface of the first quartz block 4 forming the opening 8 and the surface of the substrate 2 is set to 0.5 mm. Advantages obtained by the structure of the long chamber will be explained below.

When the atmospheric inductively-coupled plasma is generated in a space of a lump of a rectangular parallelepiped shape in the same manner as in a common cylindrical inductively-coupled plasma torch in related art, annular-shaped (donut-shaped) plasma is easily generated in the chamber. That is, as the annular-shaped plasma is generated in the chamber having the rectangular parallelepiped shape, extremely high density plasma is generated only in part of the chamber, and it is difficult to perform processing which is uniform in the longitudinal direction.

On the other hand, the long annular-shaped chamber is constructed in the embodiment, therefore, the long plasma P having a rectangular shape elongated along the shape is generated. Accordingly, it is possible to perform processing which is remarkably uniform in the longitudinal direction as compared with related art. There is also an advantage that plasma generation efficiency is improved, as the high-frequency power used per a unit volume is increased because the volume of the chamber is reduced as compared with related art.

In the common inductively-coupled plasma torch in related art, it has been pointed out that the discharge becomes unstable when the gas flow amount is increased (for example, refer to Hironobu Yabuta et al., "Design and evaluation of dual inlet ICP torch for low gas consumption", Journal of Analytical Atomic Spectrometry, 17 (2002) 1090-1095 pages). This is because, it is assumed that the distance between the annular plasma and coils becomes too far to be difficult to maintain inductive coupling and the plasma misfires in a lower stream of the gas flow when the annular plasma fluctuates in the chamber.

On the other hand, the distance "g" between the lowermost surface of the first quartz block 4 forming the opening 8 and the surface of the substrate 2 is set to be pretty narrow to 0.5 mm in the embodiment, therefore, it is difficult that the annular plasma P enters a gap between the inductively-coupled plasma torch unit T and the substrate 2, and the plasma P remains inside the long chamber 7 (in an area above the gap). Accordingly, fluctuation of the annular plasma P does not occur and extremely stable long annular plasma P is maintained. Therefore, it is possible to generate plasma remarkably stably as compared with related art.

Additionally, a portion where electron density or active particle density is high in the plasma P is exposed to the surface of the substrate 2, therefore, high-speed processing or high-temperature processing can be performed.

As a result of close examination of the distance "g" between the lowermost surface of the first quartz block 4 forming the opening 8 and the surface of the substrate 2, it has been found that the fluctuation of the annular plasma P can be suppressed when the "g" is 1 mm or less. On the other hand, when the "g" is too small, effects in processing of parts or accuracy of assembly in the longitudinal direction are increased as well as the plasma flow passing through the passage and reaches the substrate 2 is weakened. Accordingly, it is desirable to set the distance "g" to 0.1 mm or more and preferably set to 0.3 mm or more.

The width of the long chamber 7 (closed continuous passage forming the long chamber 7) "d" is represented as a width "d" of a groove provided in the second quartz block 5 in the long chamber 7 in FIG. 1A. When an outer diameter of the long chamber 7 (the entire size of the long chamber 7) is "e", it is represented as a distance "e" made by an inner wall surface on the upper side of the groove provided in the second quartz block 5 and the substrate 2 in FIG. 1A. As the long chamber 7 has a long shape, the outer diameter "e" of the long chamber 7 differs in a long side portion and in a short side portion. Specifically, the outer diameter "e" of the long chamber 7 in the long side portion is smaller than the outer diameter "e" of the long chamber 7 in the short side portion.

As a result of close examination of the distances "d" (width of the long chamber 7), "e" (outer diameter of the long chamber 7) in an experimental manner, it has been found that the thermal plasma with high density is hardly generated in the long chamber 7 when "d" is lower than 1 mm. It has also been found that the thermal plasma with high density is hardly generated in the long chamber 7 when "e" is lower than 10 mm. According to the experiments, it has been found that the width "d" of the long chamber 7 is preferably 1 mm or more and the outer diameter "e" of the long chamber 7 is preferably 10 mm or more.

Moreover, the width "d" of the long chamber 7 is preferably 10 mm or less as the plasma generation efficiency is reduced when "d" is too large.

Second Embodiment

Hereinafter, Embodiment 2 of the present invention will be explained with reference to FIG. 3.

Figure 3:
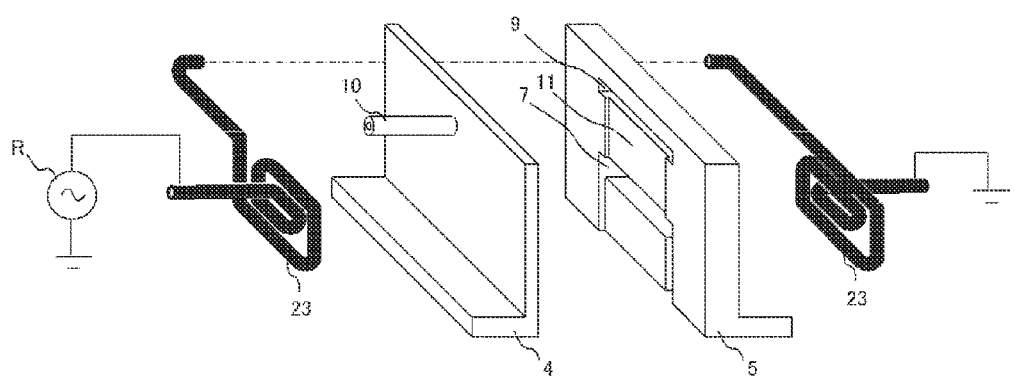
FIG. 3 is a perspective view showing a structure of a plasma processing device according to Embodiment 2 of the present invention.

FIG. 3 shows a structure of a plasma processing device according to Embodiment 2 of the present invention, which is an assembly structure view of an inductively-coupled plasma torch unit, in which perspective views of respective parts (portions) are aligned, which corresponds to FIG. 2.

In Embodiment 2, a structure in which flat spiral coils 23 are used instead of solenoid-type coils.

In this structure, there is an advantage that the intensity of electromagnetic fields generated in the long chamber 7 is increased as compared with Embodiment 1 when the same electric current flows in the spiral coils 23. Accordingly, plasma processing can be performed at higher speed or at higher temperature.

The spiral coils 23 are respectively arranged outside the first quartz block 4 and outside the second quartz block 5 as well as connected in series at positions apart from the long chamber 7 so that directions of high-frequency electromagnetic fields generated in the long chamber 7 are the same when high-frequency power is applied. The device can function only by one of these two spiral coils 23.

It is also possible to allow the coils to function by connecting one end of one coil 23 to the high frequency and by grounding the other end instead of connecting the two spiral coils 23 in series and it is possible to improve ignitability of plasma by grounding the other coil 23.

Embodiment 3

Hereinafter, Embodiment 3 of the present invention will be explained with reference to FIG. 4.

Figure 4:
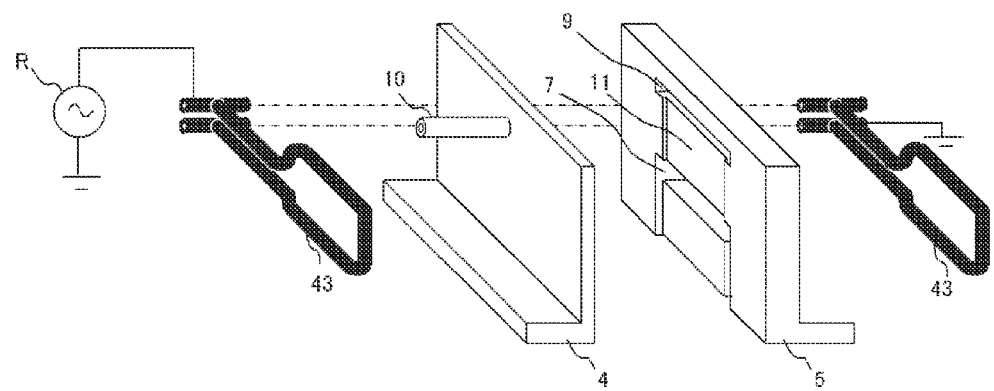
FIG. 4 is a perspective view showing a structure of a plasma processing device according to Embodiment 3 of the present invention.

FIG. 4 shows a structure of a plasma processing device according to Embodiment 3 of the present invention, which is an assembly structure view of an inductively-coupled plasma torch unit, in which perspective views of respective parts (portions) are aligned, which corresponds to FIG. 2.

In Embodiment 3, one-turn coils 43 respectively arranged outside the first quartz block 4 and outside the second quartz block 5 are connected in parallel at positions apart from the long chamber so that directions of high-frequency electromagnetic fields generated in the long chamber 7 are the same when high-frequency power is applied.

As an inductance of the entire coils is reduced by applying the above structure, therefore, the structure is effective when high-frequency power is desired to be used or when the long chamber 7 is desired to be further longer, and higher power efficiency can be obtained.

Embodiment 4

Figure 6:
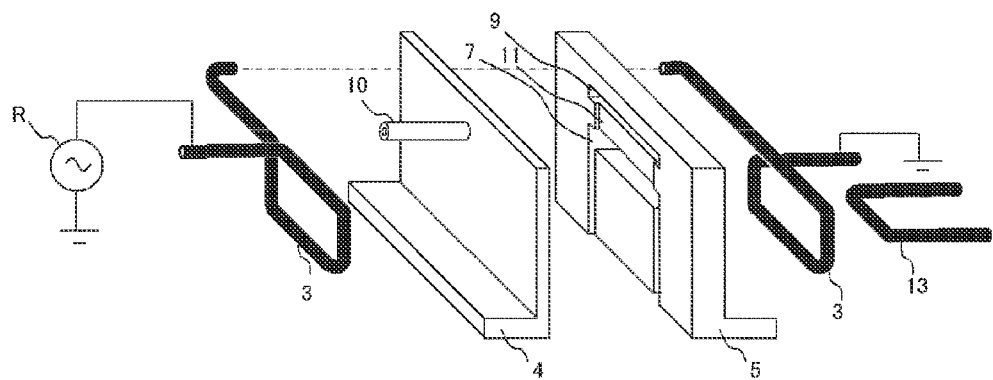
FIG. 6 is a perspective view showing the structure of the plasma processing device according to Embodiment 4 of the present invention.
Figure 7:
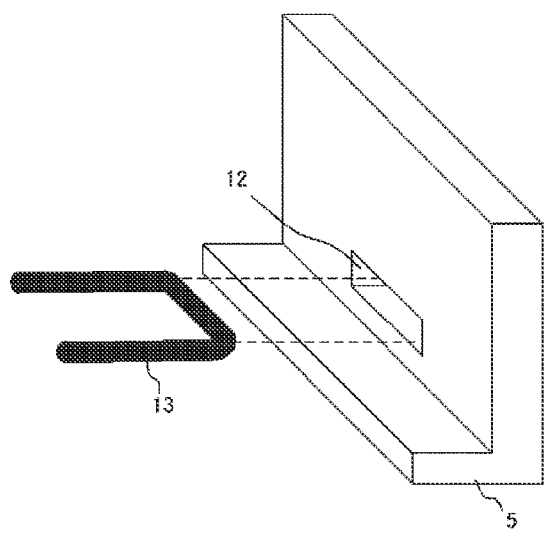
FIG. 7 is a perspective view showing the structure of the plasma processing device according to Embodiment 4 of the present invention.

Hereinafter, Embodiment 4 of the present invention will be explained with reference to FIG. 5 to FIG. 7.

Figure 5:
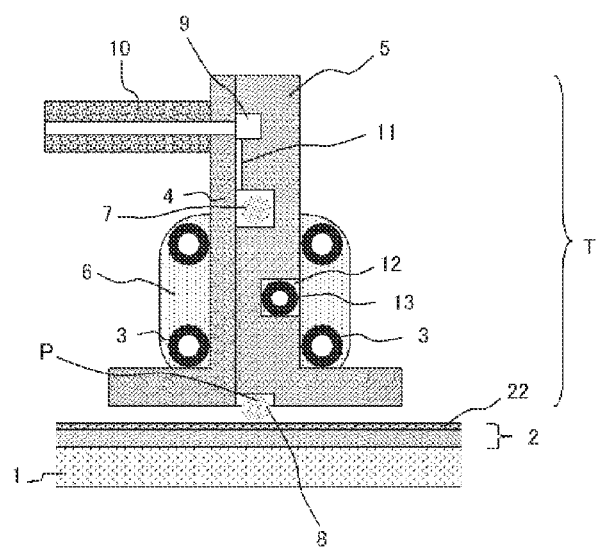
FIG. 5 is a cross-sectional view showing a structure of a plasma processing device according to Embodiment 4 of the present invention.

FIG. 5 shows a structure of a plasma processing device according to Embodiment 4 of the present invention, which is a cross-sectional view taken along a surface perpendicular to the longitudinal direction of an inductively-coupled plasma torch unit, which corresponds to FIG. 1A. FIG. 6 is an assembly structure view of the inductively-coupled plasma torch unit, in which perspective views of respective parts (portions) are aligned, which corresponds to FIG. 2. FIG. 7 is a view showing some parts of FIG. 6 in a right-and-left inverted manner.

In Embodiment 4, a groove 12 is provided outside (a reverse surface of the groove forming the long chamber 7) the second quartz block 5, and a copper pipe 13 is arranged inside the groove 12 as a grounded conductor. The groove 12 has a long shape in a direction parallel to the long chamber 7, which is shorter than a length of the longitudinal direction of the coils. The copper pipe 13 is formed in a U-shape and adhered to the groove 12 by the adhesive 6 in the same manner as the solenoid coils 3. It is possible to further cool the second quartz block 5 by allowing a refrigerant such as water to flow in the copper pipe 13.

As electrostatic fields in the long chamber 7 are increased as compared with Embodiment 1 by applying the above structure, it is possible to increase ignitability of plasma. As higher high-frequency power can be applied because cooling efficiency is increased, it is possible to perform processing at higher speed or processing at higher temperature.

Embodiment 5

Hereinafter, Embodiment 5 of the present invention will be explained with reference to FIG. 8.

Figure 8:
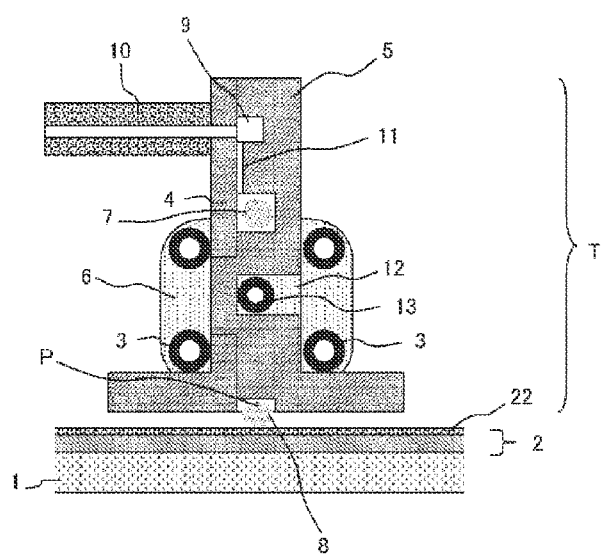
FIG. 8 is a cross-sectional view showing a structure of a plasma processing device according to Embodiment 5 of the present invention.

FIG. 8 shows a structure of a plasma processing device according to Embodiment 5 of the present invention, which is a cross-sectional view taken along a surface perpendicular to the longitudinal direction of an inductively-coupled plasma torch unit, which corresponds to FIG. 1A.

In Embodiment 5, a through hole is provided in the first quartz block 4 and a convex portion surrounding the groove 12 provided in the second quartz block 5 is inserted into the through hole. Other structures are the same as those of Embodiment 4.

When applying the above structure, the grounded copper pipe 13 can be arranged closer to the long chamber 7. Accordingly, as electrostatic fields in the long chamber 7 are increased as compared with Embodiment 4 as well as cooling efficiency is increased, higher high-frequency power can be applied, and it is possible to perform processing at higher speed or processing at higher temperature.

Embodiment 6

Hereinafter, Embodiment 6 of the present invention will be explained with reference to FIG. 9.

Figure 9:
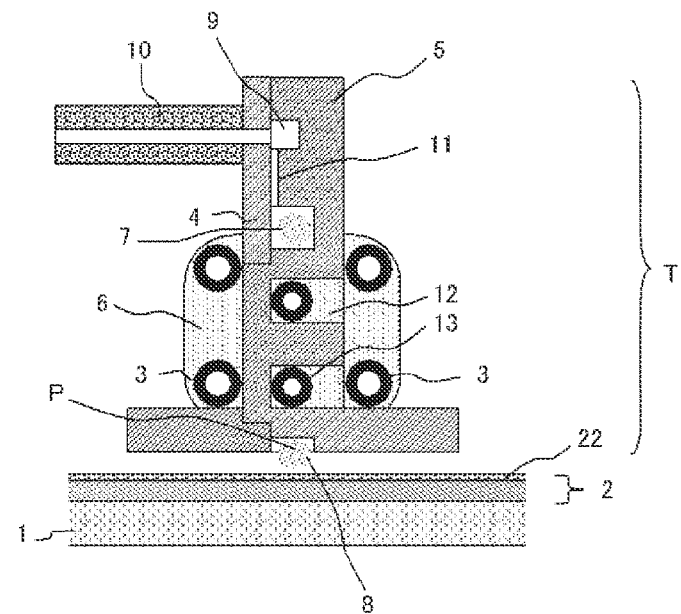
FIG. 9 is cross-sectional view showing a structure of a plasma processing device according to Embodiment 6 of the present invention.

FIG. 9 shows a structure of a plasma processing device according to Embodiment 6 of the present invention, which is a cross-sectional view taken along a surface perpendicular to the longitudinal direction of an inductively-coupled plasma torch unit, which corresponds to FIG. 1A.

Embodiment 6 differs from Embodiment 5 in a point that two grooves 12 are vertically provided in the second quartz block 5 and grounded copper pipes 13 are arranged in respective grooves 13.

When applying the above structure, the grounded copper pipes 13 can be arranged further closer to the long chamber 7. Accordingly, as electrostatic fields in the long chamber 7 are increased as compared with Embodiment 4 as well as cooling efficiency is increased, higher high-frequency power can be applied, and it is possible to perform processing at higher speed or processing at higher temperature.

Embodiment 7

Hereinafter, Embodiment 7 of the present invention will be explained with reference to FIG. 10.

Figure 10:
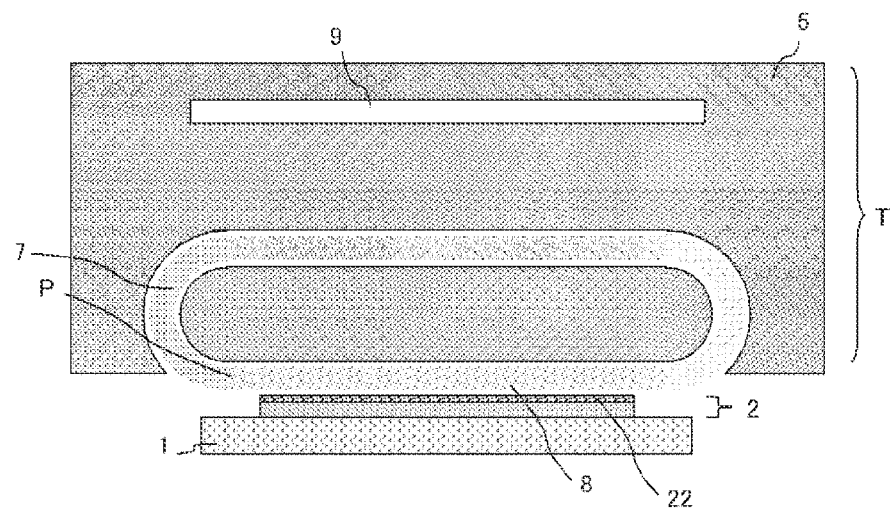
FIG. 10 is a cross-sectional view showing a structure of a plasma processing device according to Embodiment 7 of the present invention.

FIG. 10 shows a structure of a plasma processing device according to Embodiment 7 of the present invention, which is a cross-sectional view taken along a surface parallel to the longitudinal direction of an inductively-coupled plasma torch unit as well as perpendicular to the substrate, which corresponds to FIG. 1B.

In FIG. 10, a long chamber having a race-track shape (closed continuous string shape in which straight portions forming two long sides and a circle or an ellipse forming two short sides are connected to both ends) is shown as an example.

When applying the above structure, damage or deformation of the groove 12 due to high-temperature plasma is reduced, which can extend the lifetime of the dielectric member.

Embodiment 8

Hereinafter, Embodiment 8 of the present invention will be explained with reference to FIG. 11.

Figure 11:
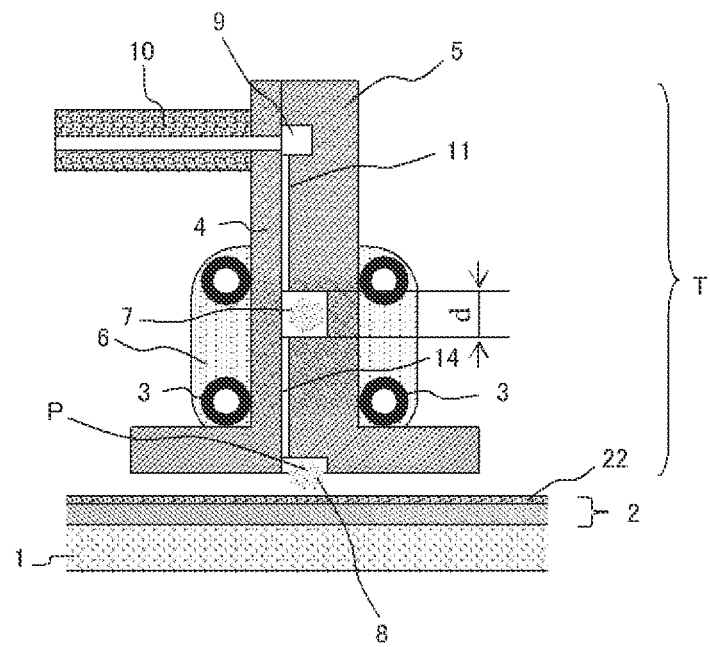
FIG. 11 is a cross-sectional view showing a structure of a plasma processing device according to Embodiment 8 of the present invention.

FIG. 11 shows a structure of a plasma processing device according to Embodiment 11 of the present invention, which is a cross-sectional view taken along a surface perpendicular to the longitudinal direction of an inductively-coupled plasma torch unit, which corresponds to FIG. 1A.

In FIG. 11, the second quartz block 5 is provided with a gas flow path 14 at an inner portion of the groove forming the long chamber 7, which facilitates the Ar gas supply to the space between the inductively-coupled plasma torch unit T which is one of long sides forming the long chamber 7 and the substrate 2. That is, the gas is supplied to the space between the inductively-coupled plasma torch unit T and the substrate 2 only from short sides forming the long chamber 7 in Embodiment 1, whereas in the embodiment, the gas supply is promoted through the gas flow path 14 as a gap between the two long sides. Accordingly, Ar density in the space between the inductively-coupled plasma torch unit T and the substrate 2 is increased (as the entrainment of air often occurs in Embodiment 1). Therefore, further stable plasma can be obtained.

It is necessary to form the gas flow path 14 to be sufficiently thin in thickness (the size of a gap in a right and left direction of FIG. 11) to such a degree that a ring-shaped plasma formed in the long chamber 7 does not enter the path. As the high-density thermal plasma is hardly generated inside the long chamber 7 when "d" is lower than 1 mm, the thickness of the gas flow path 14 is preferably lower than 1 mm.

Embodiment 9

Hereinafter, Embodiment 9 of the present invention will be explained with reference to FIG. 12.

Figure 12:
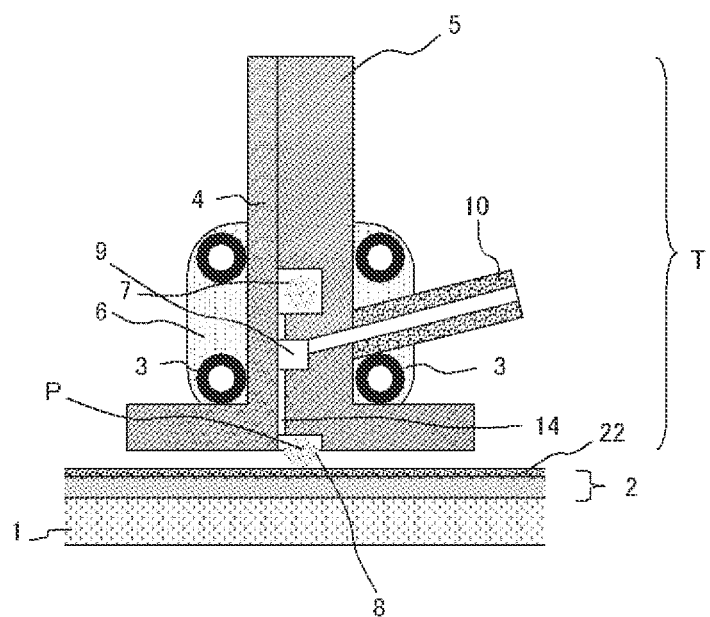
FIG. 12 is a cross-sectional view showing a structure of a plasma processing device according to Embodiment 9 of the present invention.

FIG. 12 shows a structure of a plasma processing device according to Embodiment 9 of the present invention, which is a cross-sectional view taken along a surface perpendicular to the longitudinal direction of an inductively-coupled plasma torch unit, which corresponds to FIG. 1A.

In FIG. 12, the second quartz block 5 is provided with the gas flow path 14 at the inner portion of the groove forming the long chamber 7 and the plasma gas manifold 9 at the inner portion of the groove forming the long chamber 7.

When applying the above structure, the gas supply to two long sides forming the long chamber 7 can be performed further uniformly, which increases Ar density in the space between the inductively-coupled plasma torch unit T and the substrate 2 (as the entrainment of air often occurs in Embodiment 1). Therefore, further stable plasma can be obtained.

Embodiment 10

Hereinafter, Embodiment 10 of the present invention will be explained with reference to FIG. 13.

Figure 13:
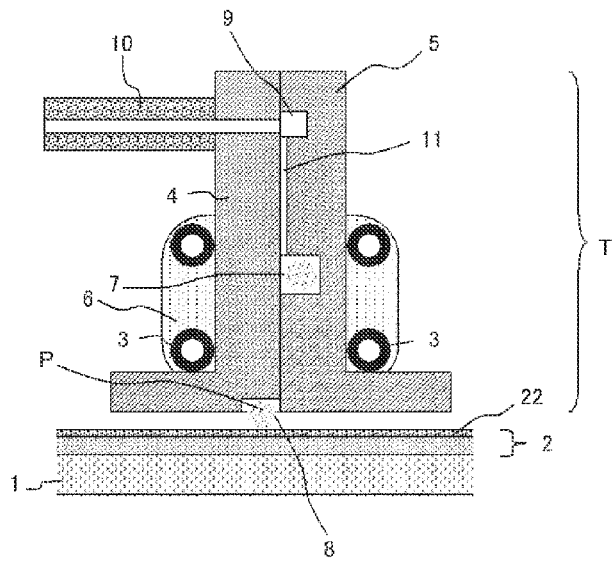
FIG. 13 is a cross-sectional view showing a structure of a plasma processing device according to Embodiment 10 of the present invention.

FIG. 13 shows a structure of a plasma processing device according to Embodiment 10 of the present invention, which is a cross-sectional view taken along a surface perpendicular to the longitudinal direction of an inductively-coupled plasma torch unit, which corresponds to FIG. 1A.

In FIG. 13, a groove provided in the lowermost portion of the first quartz block 4 and a groove provided in the second quartz groove 5 form the annular-shaped long chamber 7 as a whole through grooves provided in both the first quartz block 4 and the second quartz block 5 as not-shown grooves in the short edge side. That is, the long chamber 7 is provided along the surface perpendicular to the surface formed by the substrate mounting table 1, however, the chamber 7 is slightly inclined. Such structure is included in an application range of the present invention.

Embodiment 11

Hereinafter, Embodiment 11 of the present invention will be explained with reference to FIG. 14 and FIG. 15.

Figure 14:
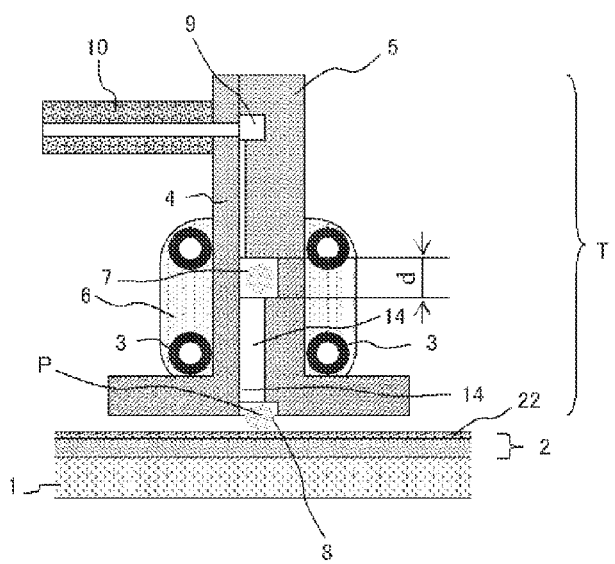
FIG. 14 is a cross-sectional view showing a structure of a plasma processing device according to Embodiment 11 of the present invention.

FIG. 14 shows a structure of a plasma processing device according to Embodiment 11 of the present invention, which is a cross-sectional view taken along a surface perpendicular to the longitudinal direction of an inductively-coupled plasma torch unit, which corresponds to FIG. 1A. FIG. 15 is an assembly structure view of the inductively-coupled plasma torch unit shown in FIG. 14, in which perspective views of respective parts (portions) are aligned, which corresponds to FIG. 2.

Figure 15:
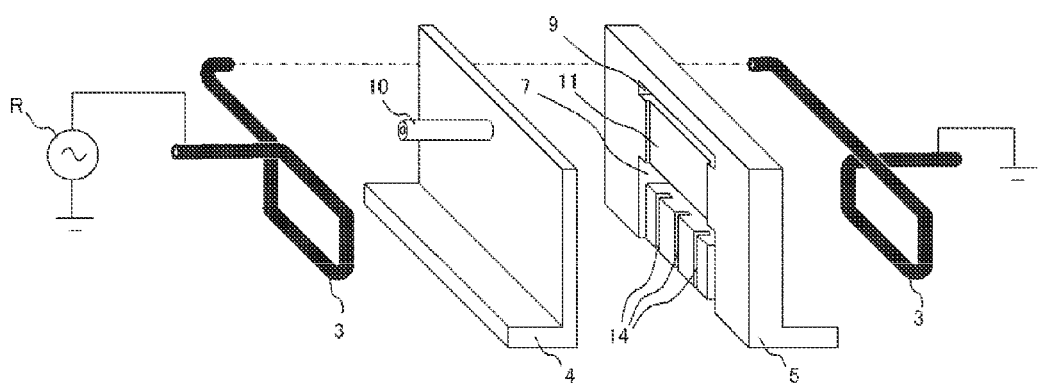
FIG. 15 is a perspective view showing a structure of a plasma processing device according to Embodiment 11 of the present invention.

In FIG. 14 and FIG. 15, the second quartz block 5 is provided with gas flow paths 14 at the inner portion of the groove forming the long chamber 7, which facilitates the Ar gas supply to the space between the inductively-coupled plasma torch unit T which is one of long sides forming the long chamber 7 and the substrate 2. The embodiment differs from Embodiment 8 in a point that the gas flow paths 14 are formed by plural relatively-deep grooves.

The gas flow paths 14 can be formed by both the gap which is entirely thin similar to Embodiment 8 and the grooves, not limited only to grooves.

When applying the above structure, the gas supply is further promoted as compared with Embodiment 8 and the Ar density in the space between the inductively-coupled plasma torch unit T and the substrate 2 is increased, therefore, further stable plasma can be obtained.

It is necessary to form the gas flow path 14 (the size of a gap in a right and left direction of FIG. 14) to be sufficiently thin in thickness to such a degree that a ring-shaped plasma formed in the long chamber 7 does not enter the path. As the high-density thermal plasma is hardly generated inside the long chamber 7 when "d" is lower than 1 mm, the width of the gas flow path 14 is preferably lower than 1 mm.

Embodiment 12

Hereinafter, Embodiment 12 of the present invention will be explained with reference to FIG. 16A, FIG. 16B and FIG. 16C.

Figure 16A:
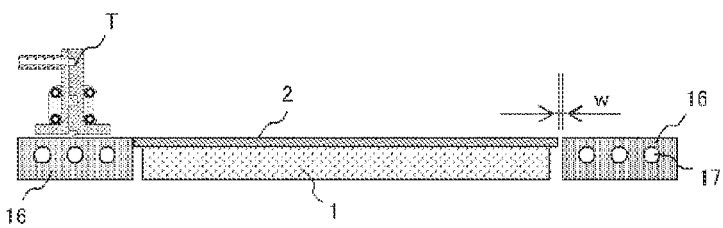
FIG. 16A is a cross-sectional view showing a structure of a plasma processing device according to Embodiment 12 of the present invention.
Figure 16B:
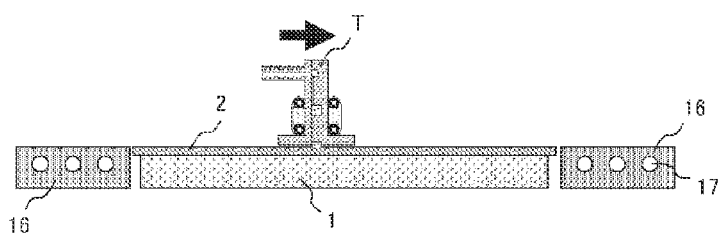
FIG. 16B is cross-sectional view showing the structure of a plasma processing device according to Embodiment 12 of the present invention.
Figure 16C:
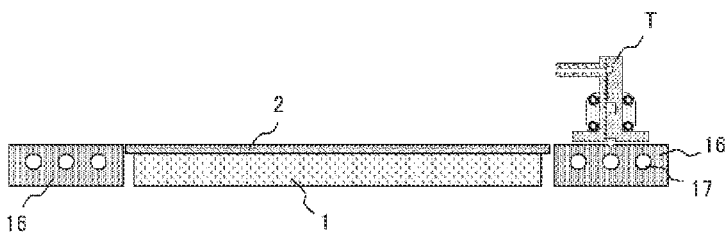
FIG. 16C is cross-sectional view showing the structure of a plasma processing device according to Embodiment 12 of the present invention.

FIG. 16A, FIG. 16B and FIG. 16C show a structure of a plasma processing device according to Embodiment 12 of the present invention, which is a cross-sectional view taken along a surface perpendicular to the longitudinal direction of an inductively-coupled plasma torch unit. FIG. 16A shows a preliminary stage in which an ignition sequence/acceleration of the inductively-coupled plasma torch unit T is performed, FIG. 16B shows a stage during plasma processing and FIG. 16C shows a stage in which deceleration/flameout is performed after the plasma processing is completed.

In FIG. 16A, FIG. 16B and FIG. 16C, flat-plate shaped covers 16 are provided at both sides of the substrate mounting table 1. The covers 16 are provided at both sides of the substrate mounting table 1 so as to surround edge portions of the substrate 2 when the substrate 2 is arranged. The covers 16 are arranged so that surfaces of the covers 16 and the surface of the substrate 2 are positioned on the same plane. Refrigerant flow paths 17 for cooling the covers 16 are provided inside the covers 16. The covers 16 have a function of protecting the device from plasma and a function of keeping the shape of the annular chamber to be fixed so that ignition/flameout of plasma can be smoothly performed. It is preferable that a gap "w" generated between the cover 16 and the substrate 2 when the substrate 2 is placed on the substrate mounting table 1 is as small as possible.

It is preferable that at least the surfaces of the covers 16 are made of an insulating material. The above structure can effectively suppress the arc discharge between plasma and the covers 16. When at least the surfaces of the covers 16 are made of the insulating material, it is preferable that the entire covers 16 are made of insulators such as quartz and ceramics as well as it is also preferable to use a metal (conductor) such as stainless steel or aluminum on which an insulating film is formed by thermal spraying, CVD, coating and so on.

Embodiment 13

Hereinafter, Embodiment 13 of the present invention will be explained with reference to FIG. 17 and FIG. 18.

Figure 17:
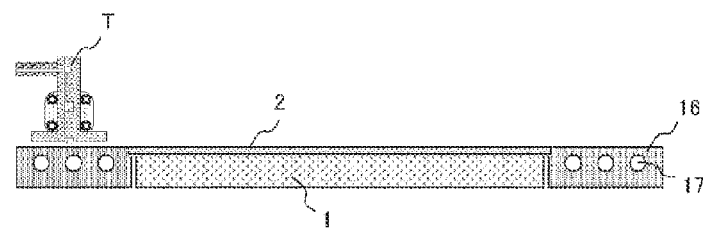
FIG. 17 is a cross-sectional view showing a structure of a plasma processing device according to Embodiment 13 of the present invention.

FIG. 17 shows a structure of a plasma processing device according to Embodiment 13 of the present invention, which is a cross-sectional view taken along a surface perpendicular to the longitudinal direction of an inductively-coupled plasma torch unit. FIG. 17 shows a preliminary stage in which an ignition sequence/acceleration of the inductively-coupled plasma torch unit T is performed. FIG. 18 shows a structure of a plasma processing device according to Embodiment 13 of the present invention, which is a cross-sectional view taken along a surface parallel to the longitudinal direction of the inductively-coupled plasma torch unit as well as perpendicular to the substrate, which corresponds to FIG. 1B.

The case where the gap "w" is generated between the cover 16 and the substrate 2 when the substrate 2 is placed on the substrate mounting table 1 is shown in Embodiment 12. However, in the present embodiment, the device is configured so that the gap is not generated as shown in FIG. 17. Although fluctuation or flameout of plasma may occur when the inductively-coupled plasma torch unit T passes in the vicinity of the gap "w" in Embodiment 12, this can be effectively suppressed in the present embodiment. In order to realize such configuration, it is possible to consider a method in which the covers 16 are set to be movable and the substrate 2 is placed on the substrate mounting table 1, then, the covers 16 are allowed to be closer toward the substrate 2 slowly by using a motor drive mechanism, an air drive mechanism, a spring drive mechanism or the like to be pressed onto the substrate 2.

Figure 18:
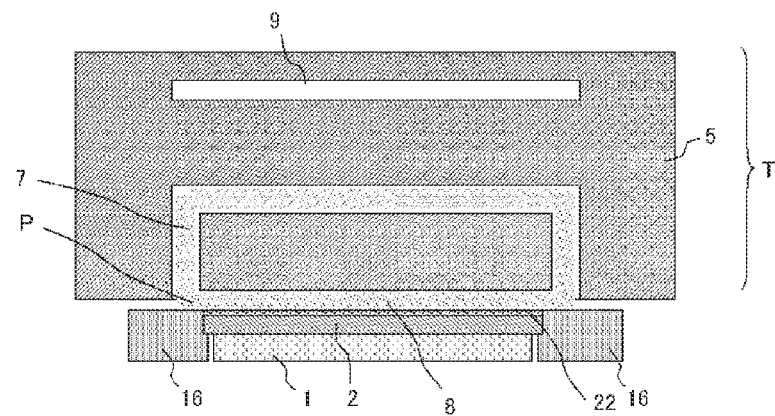
FIG. 18 is a cross-sectional view showing the structure of the plasma processing device according to Embodiment 13 of the present invention.
Figure 19:
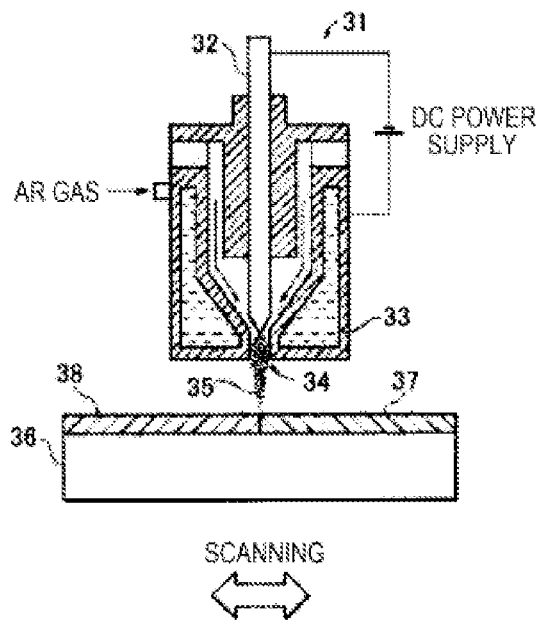
FIG. 19 is a cross-sectional view showing a structure of a plasma processing device according to a related-art example.
Figure 20:
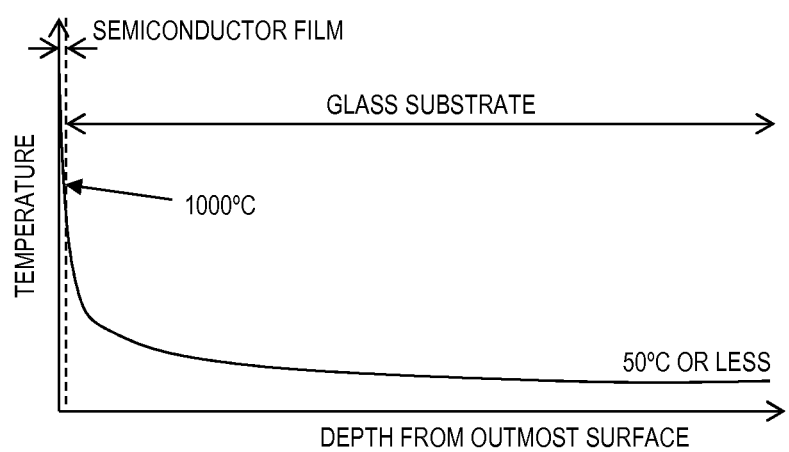
FIG. 20 is a conceptual graph showing the relation between the depth from the outermost surface of the substrate and the temperature according to the related-art example.

As a length of the opening 8 is larger than a width of the substrate 2 in FIG. 18, it is possible to process the entire thin film 22 in the vicinity of the surface of the substrate 2 by one scanning (to relatively move the inductively-coupled plasma torch unit T and the substrate mounting table 1). The flat-plate shaped covers 16 are provided at both sides of the substrate mounting table 1. The covers 16 have the function of protecting the device from plasma and the function of keeping the shape of the annular chamber to be fixed so that instability/flameout of plasma can be suppressed.

The reason why the refrigerant flow paths are not provided inside the covers 16 in FIG. 18 is that the inflow of thermal energy to the covers 16 from the inductively-coupled plasma torch unit T is relatively smaller as the inductively-coupled plasma torch unit T passes over the covers 16 for a short period of time. There may be a case where it is preferable to cool the device by water by providing refrigerant flow paths inside the covers 16 depending on the character of processing.

The plasma processing devices and methods described above are just typical examples in the application range of the present invention.

For example, it is preferable that the inductively-coupled plasma torch unit T is scanned with respect to the fixed substrate placing table 1, and it is also preferable that the substrate placing table 1 is scanned with respect to the fixed inductively-coupled plasma torch unit T.

It is also possible to perform high-temperature treatment to the vicinity of the surface of the substrate 2 by various structures according to the present invention. Specifically, the present invention can be applied to not only crystallization of the semiconductor film for TFT and improvement of the semiconductor film for a solar cell but also various surface processing such as clean-up and the reduction of degassing of a protective layer of a plasma display panel, the surface planarization and the reduction of degassing of a dielectric layer made of an aggregation of silica particles, the reflow of various electronic devices, and plasma doping using a solid impurity source. The present invention can be also applied to a method of manufacturing solar cells, in which powder obtained by crushing a silicon ingot is applied on the substrate to be irradiated with plasma and melted to thereby obtain a polycrystalline silicon film.

It is also possible to use an ignition source for facilitating the ignition of plasma. As the ignition source, a sparking apparatus for ignition used for a gas water heater and so on can be applied.

Although the present invention can be applied relatively easily when the substrate 2 made of the insulator is used, the arc discharge is liable to occur on the surface of the substrate 2 when the substrate 2 is made of a conductor or a semiconductor, or when the thin film 22 is made of a conductor or a semiconductor. It is possible to use a method of processing the surface of the substrate 2 after the insulating film is formed on the surface of the substrate 2 for preventing the above problem.

The word "thermal plasma" is used in the explanation for simplification, however, it is strictly difficult to distinguish between thermal plasma and low-temperature plasma. It is also difficult to distinguish types of plasma only based on the thermal equilibria, for example, as commented in "Non-equilibria of thermal plasma" by TANAKA Yasunori in a journal of plasma and fusion research Vol. 82, NO. 8 (2006) pp. 479-483. An object of the present invention is to perform heat treatment to the substrate, and the present invention can be applied to the technique of irradiating high-temperature plasma regardless of words such as thermal plasma, thermal equilibria plasma and high-temperature plasma.

Though the case where high-temperature heat treatment is performed uniformly to the vicinity of the surface of the substrate for a very short period of time has been explained in detail as an example, the present invention can be also applied to the case where low-temperature plasma processing is performed to the substrate by irradiating the substrate with plasma by a reactant gas or with plasma and the reactant gas flow at the same time. When the reactant gas is mixed with the plasma gas, etching or CVD can be realized by irradiating the substrate with plasma by the reactant gas.

Alternatively, when a gas including a reactant gas as a shielding gas is supplied to the vicinity of the plasma gas while using a noble gas or a gas obtained by adding a small amount of $H_2$ gas to the noble gas as a plasma gas, thereby irradiating the substrate with plasma and the reactant gas flow at the same time and realizing plasma processing such as etching, CVD and doping.

When using the gas mainly containing argon as the plasma gas, thermal plasma is generated as explained in the embodiments in detail. On the other hand, when using a gas mainly containing helium as a plasma gas, relatively low-temperature plasma can be generated. It is possible to perform processing such as etching and film deposition without heating the substrate too much by using the above method.

As reactant gases used for etching, there are halogen-containing gases such as $C_xF_y$ (x and y are natural numbers) and $SF_6$, whereby performing etching of silicon, silicon compounds and the like. When $O_2$ is used as the reactant gas, removal of organic matters, resist ashing and so on can be performed. As reactant gases used for CVD, there are monosilane, disilane and so on, whereby performing deposition of silicon and silicon compounds. Alternatively, when using a mixed gas of an organic gas containing silicon represented by TEOS (Tetraethoxysilane) and $O_2$, a silicon oxide film can be deposited.

Other various low-temperature plasma processing such as surface processing for improving water repellency and hydrophilia can be performed. As the structure of the present invention relates to the inductively-coupled type device, the arc discharge does not easily occur even when higher power density per a unit volume is inputted, therefore, higher density plasma can be generated. As a result, higher reaction speed can be obtained and the entire desired treated region of the substrate can be processed efficiently for a short period of time.

INDUSTRIAL APPLICABILITY

The present invention can be applied to crystallization of the semiconductor film for TFT and improvement of the semiconductor film for a solar cell. The present invention is also useful for generating plasma stably and efficiently as well as processing the entire desired treated region of the substrate efficiently for a short period of time, when performing high-temperature heat treatment uniformly to the vicinity of the surface of the substrate for a very short period of time in various surface processing such as clean-up and the reduction of degassing in a protective layer of a plasma display panel, the surface planarization and the reduction of degassing in a dielectric layer made of an aggregation of silica particles, the reflow of various electronic devices, and plasma doping using a solid impurity source. The present invention is also useful for processing the entire desired treated region of the substrate for a short period of time efficiently in low-temperature plasma processing such as etching, deposition, doping and surface improvement in the manufacture of various electronic devices.

The invention claimed is:

1. A plasma processing device comprising:
a dielectric member;
an annular chamber communicating with an opening and surrounded by the dielectric member except for at the opening;
a gas supply pipe for introducing a gas into the annular chamber;
a coil provided in a vicinity of the annular chamber;
a high-frequency power supply connected to the coil; and
a substrate mounting table for arranging the substrate close to the opening,
wherein the annular chamber is looped along a surface perpendicular to a surface formed by the substrate mounting table, and is a closed continuous string shaped chamber, and
the plasma processing device is an inductively-coupled plasma torch unit.

2. The plasma processing device according to claim 1,
wherein the annular chamber has a long shape,
the opening is a long and linear shape,
the coil has a long shape in a direction parallel to a longitudinal direction of the opening, and
a moving mechanism which can relatively move the chamber and the substrate mounting table in a direction perpendicular to the longitudinal direction of the opening is included.

3. The plasma processing device according to claim 1,
wherein the coil is provided along the surface perpendicular to a surface formed by the substrate mounting table.

4. The plasma processing device according to claim 1,
wherein the dielectric member includes two bonded dielectric blocks, and
the annular chamber includes a groove in at least one of the two dielectric blocks.

5. The plasma processing device according to claim 4,
wherein the coils are provided outside both of the two dielectric blocks.

6. The plasma processing device according to claim 1,
wherein a distance between an end surface of the opening and the substrate is 1 mm or less.

7. The plasma processing device according to claim 1,
wherein a width of the annular chamber is 1 mm or more and 10 mm or less.

8. The plasma processing device according to claim 1,
wherein an outer diameter of the annular chamber is 10 mm or more.

9. The plasma processing device according to claim 1,
wherein an opening width of the opening is equal to the width of the annular chamber.

10. The plasma processing device according to claim 1, further comprising:
a grounded conductor provided between the dielectric member and an the inner side of the coil.

11. The plasma processing device according to claim 1,
wherein a flat-plate shaped cover is provided around the substrate mounting table so as to surround an edge portion of the substrate when the substrate is arranged.

12. The plasma processing device according to claim 11,
wherein the surface of the cover and the surface of the substrate at the time of arranging the substrate are positioned on the same plane.

13. An inductively-coupled plasma processing method comprising:
generating high-frequency electromagnetic fields in a closed continuous string shaped annular chamber, the annular chamber surrounded by a dielectric member except for at an opening of the dielectric member;
supplying high-frequency power to a coil while supplying a gas into the annular chamber to generate plasma; and
exposing a substrate to the plasma in a vicinity of the opening while arranging the substrate close to the opening to process a surface of the substrate,
wherein the generating the plasma further includes generating the plasma inside the annular chamber looped along a surface perpendicular to a surface formed by the substrate.

* * * * *